(12) United States Patent
Hille et al.

(10) Patent No.: US 7,709,887 B2
(45) Date of Patent: May 4, 2010

(54) SEMICONDUCTOR COMPONENT AND METHOD

(75) Inventors: Frank Hille, München (DE); Frank Umbach, München (DE); Anton Mauder, Kolbermoor (DE); Hans-Joachim Schulze, Ottobrunn (DE); Thomas Laska, München (DE); Manfred Pfaffenlehner, München (DE)

(73) Assignee: Infineon Technologies Austria AG, Villach (AT)

( * ) Notice: Subject to any disclaimer, the term of this patent is extended or adjusted under 35 U.S.C. 154(b) by 502 days.

(21) Appl. No.: 11/604,984

(22) Filed: Nov. 28, 2006

(65) Prior Publication Data

US 2007/0152268 A1    Jul. 5, 2007

(30) Foreign Application Priority Data

Nov. 28, 2005    (DE)    ........................ 10 2005 056 426

(51) Int. Cl.
*H01L 29/76* (2006.01)
(52) U.S. Cl. ................ 257/330; 257/334; 257/E29.201
(58) Field of Classification Search ................. 257/330, 257/334, E29.197, E29.2, E29.201, 329, 257/331, 333
See application file for complete search history.

(56) References Cited

U.S. PATENT DOCUMENTS

| | | | | |
|---|---|---|---|---|
| 5,284,780 A | * | 2/1994 | Schulze et al. | 438/139 |
| 5,751,024 A | | 5/1998 | Takahashi | |
| 5,895,952 A | | 4/1999 | Darwish et al. | |
| 6,624,469 B1 | * | 9/2003 | Harada | 257/330 |
| 7,345,342 B2 | * | 3/2008 | Challa et al. | 257/341 |
| 2001/0007369 A1 | * | 7/2001 | Zeng et al. | 257/483 |
| 2002/0167046 A1 | | 11/2002 | Aoki et al. | |
| 2004/0164349 A1 | * | 8/2004 | Nishiwaki et al. | 257/330 |
| 2006/0019448 A1 | * | 1/2006 | Darwish et al. | 438/270 |

FOREIGN PATENT DOCUMENTS

| | | |
|---|---|---|
| DE | 103 30 571 | 2/2005 |
| EP | 0583028 | 10/1996 |
| WO | WO 2005/062385 | 7/2005 |

* cited by examiner

*Primary Examiner*—Tuan N. Quach
(74) *Attorney, Agent, or Firm*—Dicke, Billig & Czaja, PLLC

(57) ABSTRACT

A semiconductor component and method of making a semiconductor component is disclosed. In one embodiment, the semiconductor component includes a drift region of a first conductivity type, a body region of a second conductivity type, and a trench extending into the body region. A semiconductor region of the first conductivity type is in contact with the drift region and the body region and is arranged at a distance from the trench.

21 Claims, 9 Drawing Sheets

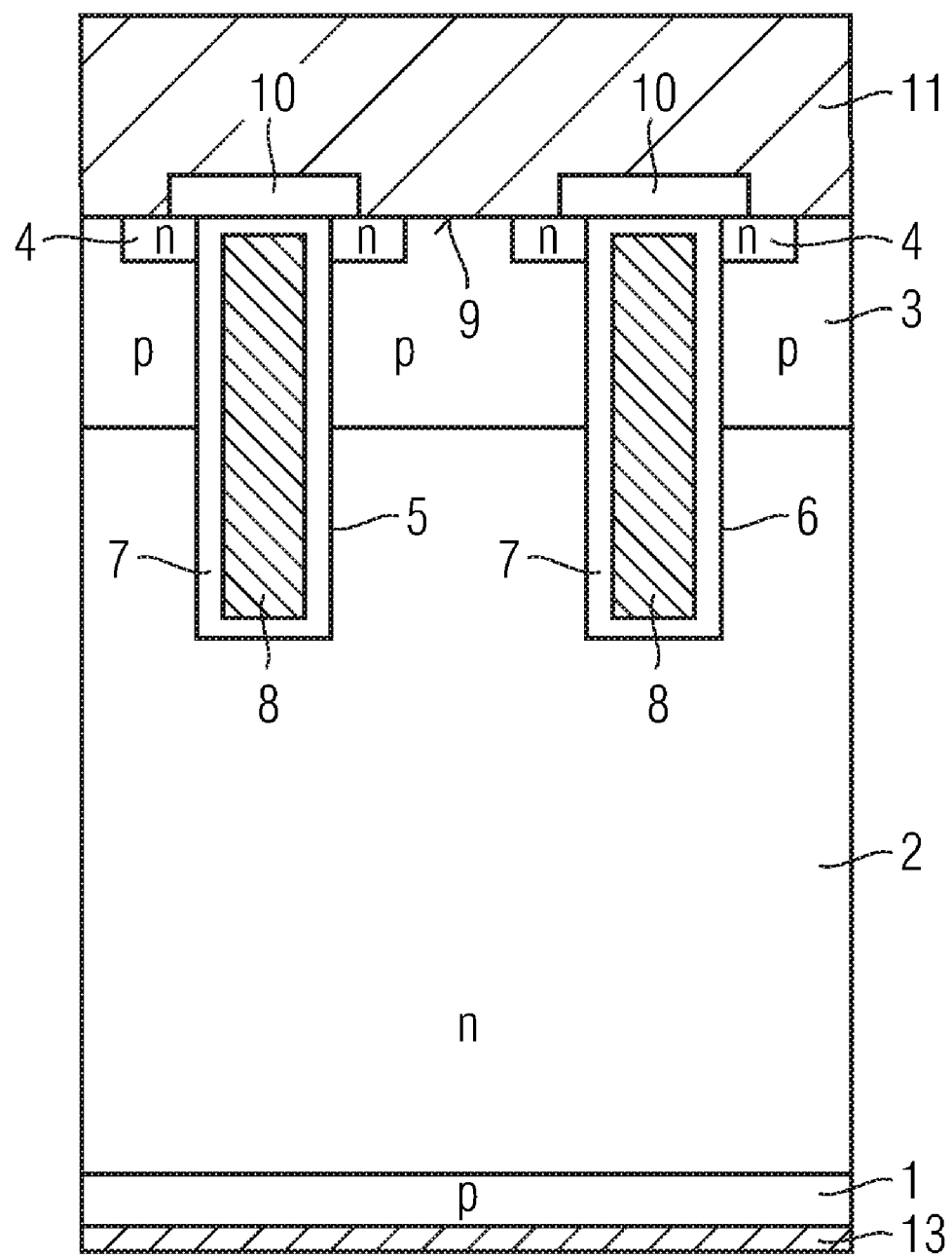

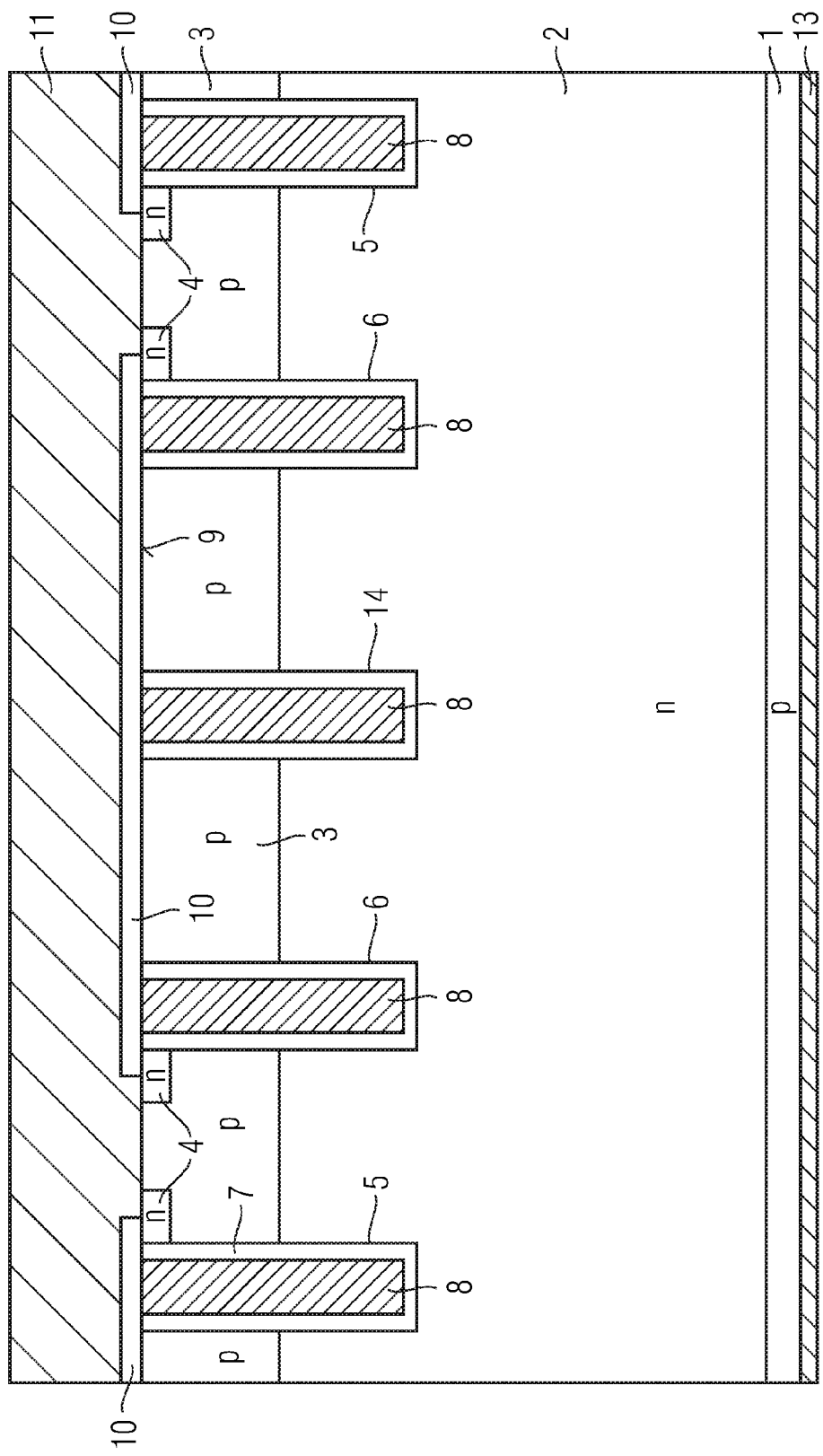
FIG 2 --PRIOR ART--

SEMICONDUCTOR COMPONENT AND METHOD

CROSS-REFERENCE TO RELATED APPLICATIONS

This Utility Patent Application claims priority to German Patent Application No. DE 10 2005 056 426.7 filed on Nov. 28, 2005, which is incorporated herein by reference.

FIELD OF INVENTION

The present invention relates to the field of semiconductor technology and in particular power electronics.

BACKGROUND

Power components are defined below as elements which are used, for example, in automotive and industrial electronics and have at least one component provided for the switching of voltages and currents. The voltage and current range of such power or high-power components is in a range of 5 V to 6500 V per component and current intensities of a few milliamperes to hundreds of amperes per component.

The present invention relates to an insulated gate bipolar transistor (IGBT), which usually at least includes a zone of a second conduction type (collector layer), a region (drift zone) of the first conduction type, a body region of the second conduction type, into which well zones of the first conduction type are embedded, and a gate electrode above the well zone, the gate electrode being spaced apart by means of an insulating layer. Here and hereinafter an IGBT shall also be understood to mean an IEGT (IEGT=Injection Enhanced Gates Transistor).

The present invention relates in particular to a trench IGBT that is used at higher voltages from approximately 600 V upward.

The basic structure of such an IGBT is illustrated in FIG. 1a.

A semiconductor body has a p-conducting collector zone 1 provided with a metallization 13, on which collector zone a first, n-conducting body zone (drift zone) 2 and a second, p-conducting body zone 3 are provided successively. An n-conducting emitter zone 4 is embedded into the p-conducting body zone 3. IGBT cells are illustrated in the present example, so that two emitter zones 4 are correspondingly present.

Trenches 5, 6 penetrate through the emitter zone 4 and the p-conducting body zone 3, and reach right into the n-conducting body zone. Said trenches 5, 6 are lined with an insulating layer 7 made of silicon dioxide for example, the insulating layer acting as gate oxide. The interior of the trenches 5, 6 is filled with a polycrystalline silicon that forms a gate electrode 8. The gate electrode 8 is covered with an insulating layer 10 made of, for example, silicon dioxide, silicon nitride or made of amorphous silicon carbide, with the result that the conductive material 8 is electrically isolated from a metallization serving as emitter contact 11 on a main surface 9.

Dopings can be configured oppositely in each case, so that the p-type collector layer 1 designated for example in FIG. 1a can also become an n-type collector layer, in this case the drift zone 2 having p-doping, the body zone 3 being n-doped and the wells 4 incorporated into the body zone 3 being p-doped.

As is illustrated in FIG. 1b, a semiconductor component includes an insulated gate trench IGBT including many, generally many hundreds of, IGBT cells connected in parallel. One cell is illustrated in FIG. 1a, while FIG. 1b represents a plurality of such cells in plan view which are arranged in a cell array. IGBTs and IEGTs are particularly suitable for higher voltages, as has already been mentioned, and three examples of said IGBTs and IEGTs are shown in FIGS. 2, 3, and 4.

In the example of FIG. 2, the distance between two cells is extended by an optional additional trench 14 without an emitter zone, while in the examples of FIGS. 3 and 4 a relatively wide p-conducting zone 15 (p-float) is located between the corresponding two cells, which zone may overlap the trench edge with a bulge 17. In the example of FIG. 4, additionally relative to the example of FIG. 3, the conductive materials 8 in the trenches 5, 6 of the adjacent cells are also connected to one another by means of a conductor layer 16. The insulating layer 7 may, if appropriate, also be made thicker at the side remote from the emitter zone 4.

High-voltage switches in power electronics, such as IGBTs and the like, are usually designed in such a way that their reverse voltage lies significantly above the typical operating voltage predefined by the application. If the operating voltage lies within the range of 600-850 V, for example, then a switch module (e.g. IGBT) made available for this is designed for example in such a way that it has a rated reverse voltage of 1200 V. As has been illustrated, such a large safety margin is necessary in order to absorb the high overvoltages that occur when the high-voltage switches are turned off, in order that destruction of the IGBT is reliably avoided. The high overvoltages are caused by high rates of current change di/dt and the always present (including parasitic) inductances ("leakage inductances"). Particularly high overvoltages occur primarily when a multiple of the rated current is to be switched off, as in the so-called overcurrent or short-circuit case.

In this regard, primarily the modern high-voltage switches which switch (off) very rapidly have proved to be problematic, which switches tend toward very high overvoltages at high leakage inductances. Examples of such modern rapidly switching IGBTs are described in T. Laska et al. "The Field Stop IGBT (FS IGBT)—A New Power Device Concept with a Great Improvement Potential", Proceedings of the 12th ISPSD, pages 355-358, 2000; M. Otsuki et al. "Investigation of the Short-Circuit Capability of 1200V Trench Gate Field-Stop IGBTs, Proceedings of the 14th ISPSD, pages 281-284, 2002; S. Dewar et al. "Soft Punch Through (SPT)—Setting New Standards in 1200V IGBT", Proc. PCIM Europe, 2000; K. Nakamura et al. "Advanced Wide Cell Pitch CSTBTs Having Light Punch-Through (LPT) Structures", Proceedings of the 14th ISPSD, pages 277-280, 2002. An FS-IGBT differs from the IGBT illustrated in FIG. 1 by virtue of the fact that a more highly defined n-type field stop layer is arranged between the p-conducting region 1 and the n-conducting layer of the base or drift zone 2. Moreover, further variations of an IGBT are known, such as e.g. a punch-through IGBT (PT-IGBT), which involve the drift zone being subdivided into a plurality of differently doped n-type regions.

FIG. 5 represents a V/t diagram in which the voltages V that occur during switch-off are plotted as a function of the time t. As can be gathered from FIG. 5, during the switching operation of a conventional IGBT, without regulating measures, the overvoltage would rise above the breakdown voltage (cf. for example "1200 V") and possibly destroy the component (curve a). When using conventional IGBTs, therefore, it is necessary to comply with a sufficient safety margin between the intermediate circuit voltage and the static breakdown voltage of the component.

In order that the overvoltage is always kept below the breakdown voltages, the switching speed is reduced in the conventional IGBTs to an extent such that the overvoltage generated at leakage inductances reliably remains below the specific breakdown voltage (e.g. 1200 V) in every conceivable operating and disturbance case. A curve b shows the behavior of an IGBT in which the switching speed has been reduced to an extent such that the breakdown voltage of 1200 V is not reached. However, high switching losses are accepted in the case of this concept.

One possibility for minimizing the switching losses consists in limiting the overvoltage by means of active intervention in the switching operation with e.g. reactivation of the switch or "clamping" with zener diodes. This switching operation is represented by a curve c in FIG. 5. However, the concept used in this case requires an additional outlay on the driving and circuitry. In both cases, the specified breakdown voltage (e.g. 1200 V) lies significantly above the usable intermediate circuit voltage range of e.g. 650-850 V.

The components are ideally intended to have the property of dynamically limiting the overvoltage. In this case, the level of the dynamic limiting voltage should lie in the region of the previously used and specified breakdown voltage of 1200 V, for example, in order to achieve low switching losses. The dynamic limiting would have the advantage that the static breakdown voltage of the components can lie below the voltage in this case. The static breakdown voltage is in this case intended to lie scarcely above the maximum intermediate circuit voltage of 1000 V, for example. The voltages of such a component which occur during the switching operation are shown by a curve d in FIG. 5. Such a component could be designed for a low breakdown voltage. Both the on-state losses and switching losses can be reduced by means of the small thickness of the component. In operating cases in which the component dynamically limits its overvoltage, the minimum possible switching losses for this case (leakage inductance and current intensity) arise.

This possibility of limiting overvoltages in IGBTs has recently been discussed as the dynamic "self-clamping property" (dynamic clamping) of an IGBT, which is based on the changes in the net space charge density of the drift region on account of an avalanche current, depleted charge carriers of the neutral region and the collector-side injection of holes (see e.g. B. M. Takei et al. "Analysis on the Self-Clamp Phenomena of IGBTs" in Proc. 11th ISPSD, Poster Session, Paper 7.1, 1999 and M. Otsuka "1200V FS-IGBT module with enhanced dynamic clamping capability", Proceedings of the 2004 ISPSD, pages 339-342, 2004).

If it is accordingly possible to configure a high-voltage switch such that, despite the presence of high leakage inductances and high rates of current change, it is able to dynamically limit a high overvoltage occurring during turn-off by means of self-clamping ("dynamic clamping") and, in the case of this loading (which may amount to as much as a multiple of the rated current at the rated voltage, for instance), upon the overshooting of a critical reverse voltage (clamping voltage), to have the ability to carry a high current of the order of magnitude of the rated current and above momentarily over many hundred ns to a few μs without splitting or destruction of the component occurring, such components would enable a reduced driving outlay in this way. In this case, the dynamically occurring overvoltage spikes are reliably kept below the maximum permissible static voltage of the component since, when the clamping voltage is overshot, the cause of the overvoltage is removed by a lengthened or increased current flow.

Therefore, significantly more freedoms for configuration, in particular with regard to a converter design, would be available to the user (minimized driving outlay and/or minimized outlay with regard to the leakage inductances). What is more, this would be very advantageous for the component manufacturer since the chips could be designed to switch even faster and thus with fewer losses without increasing the risk of excessively high overvoltages during turn-off under extreme conditions (overcurrent or short-circuit case).

In order to achieve this, the design of an IGBT chip should also be devised in a particular manner. Thus, inter alia, the rear side emitter efficiency and the field stop layer are to be dimensioned in a suitable way (see, for example, M. Otsuki et al. "1200 V FS-IGBT module with enhanced clamping capability"; Proceedings of the 2004 ISPSD, pages 339-342, 2004). For these and other reasons, there is a need for the present invention.

SUMMARY

One embodiment provides a semiconductor component having a drift region of a first conductivity type, a body region of a second conductivity type, and a trench extending into the body region. A semiconductor region of the first conductivity type is in contact with the drift region and the body region and is arranged at a distance from the trench.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1a illustrates a trench IGBT in accordance with the prior art.

FIGS. 2-4 illustrate IEGTs or IGBTs in accordance with the prior art.

DETAILED DESCRIPTION

Figure 1B:
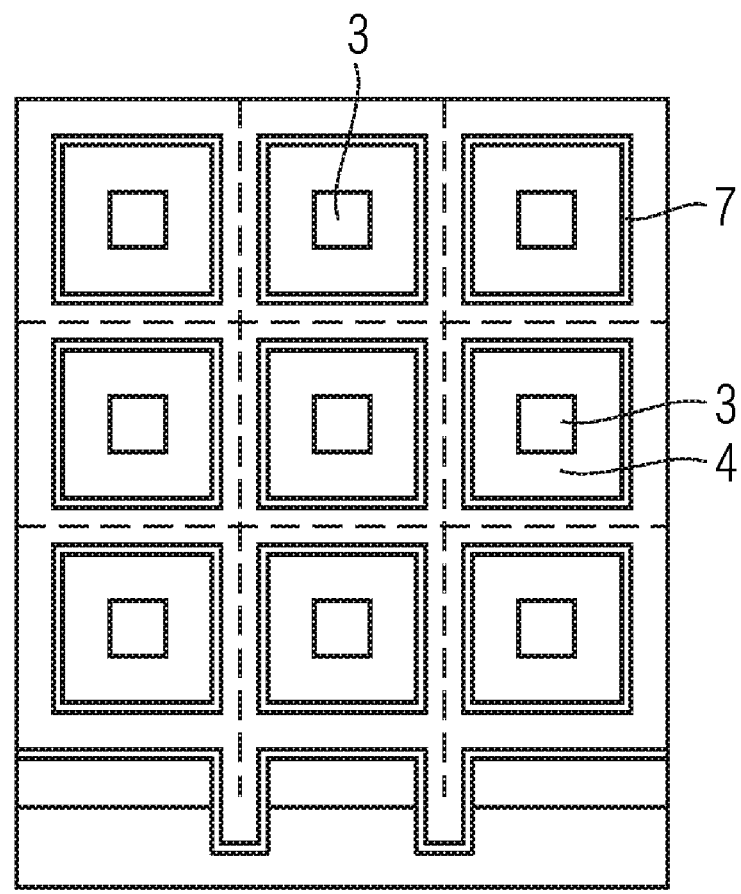
FIG. 1b illustrates a plan view of a cell array with a plurality of IGBT cells.
Figure 3:
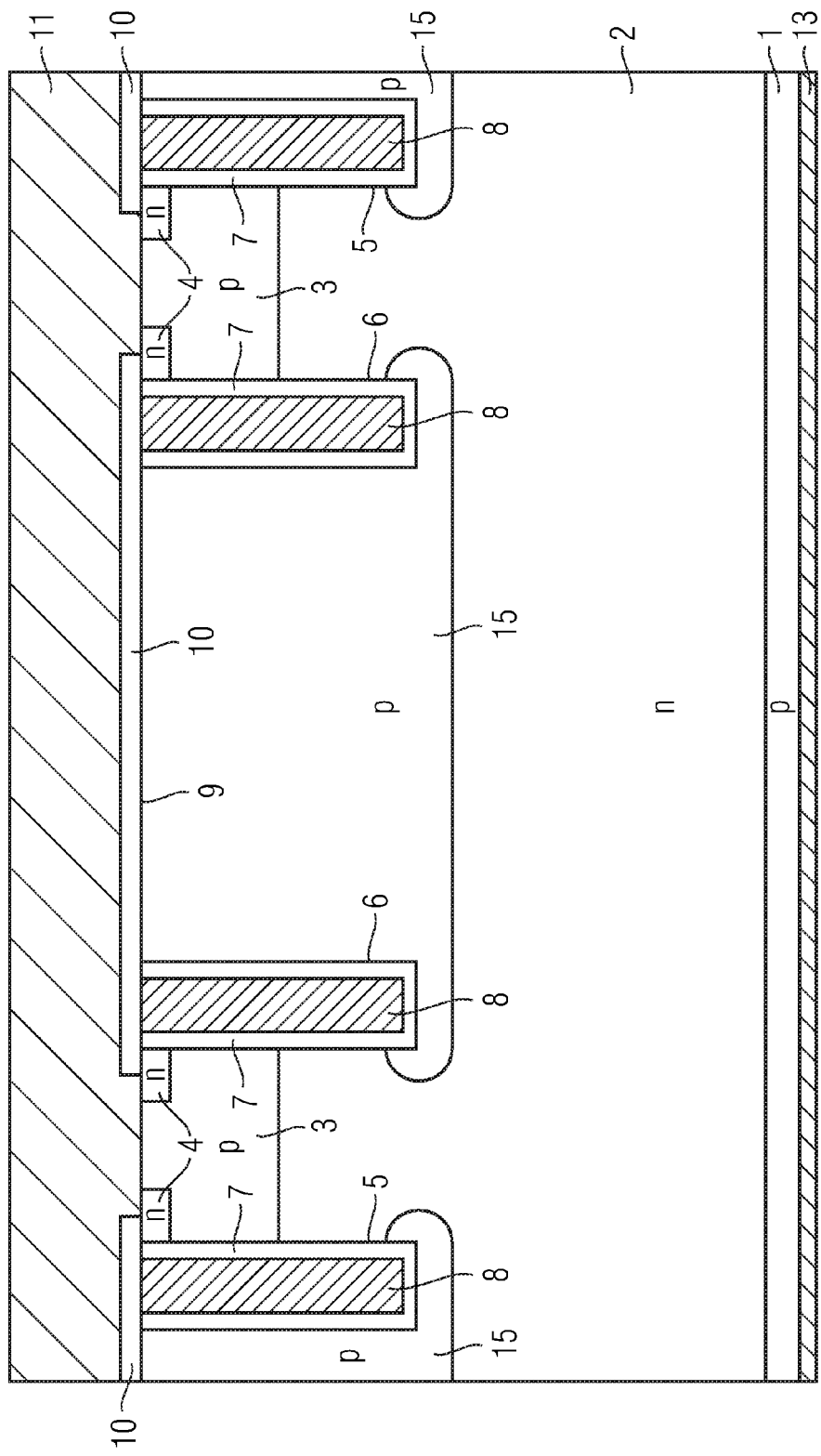
Figure 4:
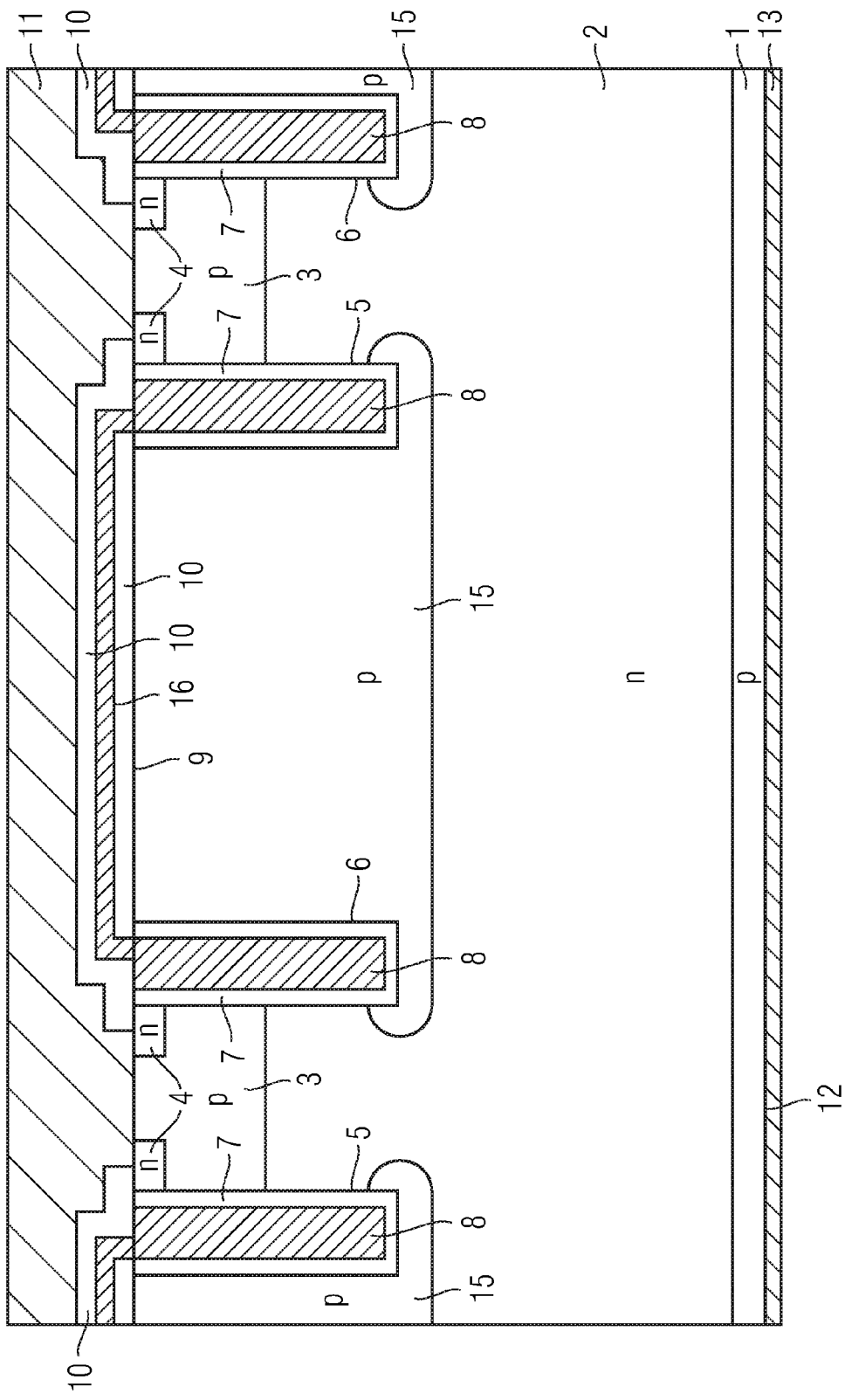
Figure 5:
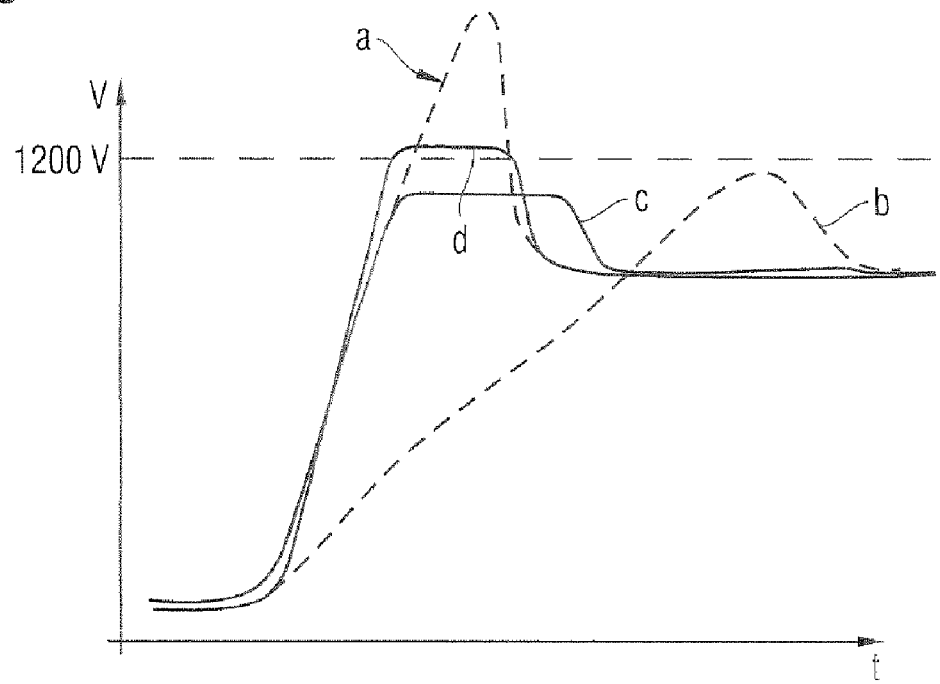
FIG. 5 illustrates voltages occurring during the switching operation in the case of various IGBTs.

In the following Detailed Description, reference is made to the accompanying drawings, which form a part hereof, and in which is shown by way of illustration specific embodiments in which the invention may be practiced. In this regard, directional terminology, such as "top," "bottom," "front," "back,"

"leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel component and in particular an IGBT which has self-limiting of dynamic overvoltages (dynamic clamping).

For the components having the property of self-limiting of dynamic overvoltages, the safety margin between the intermediate circuit voltage and the static breakdown voltage can be kept smaller, the static breakdown voltage can be kept lower, the thickness of the component can be kept smaller and, consequently, ultimately the losses can be kept lower.

In a conventional IGBT component, the point at which the breakdown takes place generally lies, on account of the high electric fields, at the edge regions of the cell array in the high-voltage edge termination.

This can result in problems such as the injection of hot charge carriers into insulating layers, which leads to a reduction of the component power and makes the possibility of a destructive bipolar breakdown likely. Therefore, it is desirable to move the breakdown point away from the edges and into each cell, since this enables higher currents to flow homogeneously via the component, so that the excess energy generated by the rapid rise in the voltage at the component can be dissipated more rapidly than would be possible if the breakdown takes place at the edges.

Therefore, it is desirable to reduce the cell blocking capability in relation to the edge blocking capability in a targeted manner or to increase the edge blocking capability with respect to the cell blocking capability likewise in a targeted manner. Furthermore, the reverse characteristic curve has a positive differential profile at breakdown, so that no splitting can occur.

Care must be taken to ensure that dynamic flipping over of the electric field does not occur in the edge. The expression "flipping over of the electric field" denotes the phenomenon where the highest field strength no longer occurs at the front side of the component, but rather at the rear side of the component. Since the blocking capability of the component decreases drastically with the flipping over of the electric field, it must be ensured that said flipping over of the electric field can occur in the edge region only after it has already taken place in the cell array beforehand. In particular, this means that it is necessary to avoid or at least reduce a charge injection below the edge.

Hitherto the problem of the high overvoltages that occur during switch-off on account of rapid rates of current change and leakage inductances has principally been solved by great efforts having been made on the part of the user, whether by means of special drive circuits or by means of reduced construction leakage inductances, to reduce the overvoltages that occur in order thus to be able to use the high-voltage switches in a satisfactory manner. However, this is associated with high additional costs in development and/or manufacturing. What is more, this procedure restricts the freedoms in the chip design.

Furthermore, it is essential that the IGBT cells are dimensioned such that the collector-emitter breakdown voltage is lower than the edge breakdown voltage, in order that the chip edge is not loaded unnecessarily highly and on one side during the dynamic clamping phase. Rather, the loading is intended to be distributed homogeneously between many cells. One possibility as to how this can be achieved is described in DE 100 19 813 C2. In this case, the weak n-type doping in the drift region between the cells or below the cells is raised in a targeted manner, but this entails a considerable additional outlay and is problematic from a process engineering standpoint, in particular with regard to accuracy and reproducibility.

By contrast, the present invention provides an IGBT which has improved overvoltage protection without having to accept the disadvantages presented in the introduction. In particular, in this case this semiconductor component is designed in such a way that the collector-emitter voltage is lower than the edge breakdown voltage without in this case having to accept the production-dictated disadvantages of an increased dopant concentration in the drift region between the cells or below the cells.

An IGBT having n-type regions below the p-type body region is described per se in U.S. Pat. No. 5,751,024. It is intended to enable an IGBT having a low forward voltage, for which purpose the n-type regions are situated in the entire region between the trenches and are not arranged at a distance from the trenches as in the present invention. EP 0 583 028 B1 proposes arranging n-type regions between p-type body regions, whereby the IGBT breaks down in the event of an overshooting of the critical voltage in the vicinity of the rectifying junction remote from the trench if a critical voltage is overshot. The n-type regions in accordance with EP 0 583 028 B1 therefore have the purpose of preventing an avalanche breakdown (avalanche generation) alongside the trench or of reducing the probability of the avalanche breakdown.

In one embodiment of the present invention, an insulated gate semiconductor component is provided having a first semiconductor region (drift region) of a first conductivity type (n), a second semiconductor region (base region) of a second conductivity type (p), which is formed on or selectively in the upper main surface of the first semiconductor region, a third semiconductor region (emitter region) of the first conductivity type (n), which is formed selectively in the upper surface of the second semiconductor region, a trench having an opening in the upper surface of the third semiconductor region and extending into the depth from the opening into the second semiconductor region, and a dielectric layer, which is buried in the trench and completely covers the bottom thereof and extends to a location which is higher than the upper main surface of the first semiconductor region, a fourth region of the first conductivity type (n) being provided, which is arranged at a distance from the trench and is in direct contact with the first and second semiconductor regions.

The body region may additionally have a layer which is more heavily doped with the conductivity carrier of the second type ($p^{++}$), in order to form a contact layer.

In contrast to the IGBT in accordance with EP 0 583 028 B1, which has n-type regions between the p-type body regions, the IGBT according to the invention provides for at least one n-type region to be arranged below the p-type body region at a distance from the trench.

In one embodiment, the IGBT according to the invention is a trench IGBT. In the semiconductor body, a trench structure having a plurality of trenches is formed in the front-side surface; that is to say that the trenches extend from the front-side surface into the semiconductor body, the trenches typically being formed in a perpendicular direction with respect to the front-side surface of the semiconductor body. In this embodiment, a penetration depth of the trenches is determined in a direction perpendicular to the front-side surface of the semiconductor body (a direction which is perpendicular to the front-side surface and which points toward the rear-side surface) and is given by the depth of the trenches.

Embedded in the trench structure of the semiconductor component according to the invention is a control electrode structure, which is electrically insulated from its surroundings, for the purpose of controlling the field effect of the semiconductor component, that is to say that control electrodes are accommodated in the trenches. In this embodiment, the control electrode structure can be electrically insulated from its surroundings by means of a customary insulation layer, such as an oxide layer. In general, therefore, at least parts of the control electrodes are positioned in the trenches in an opposite position with respect to the body regions, so that it is possible to form a conductive channel in the body regions for the purpose of electrically conductively connecting the emitter regions to the drift region by means of the field effect.

The penetration depth of the emitter and body regions into the semiconductor body and the drift region is determined, analogously to the above definition of the penetration depth of the trenches, in general in a direction which is directed from the front-side surface of the semiconductor body to the rear-side surface of the semiconductor body and which is typically perpendicular to the front-side surface of the semiconductor body.

According to one embodiment of the invention, by virtue of the fourth region of the first (n) conductivity type located below the second region of the second conductivity type (p-type body region), on the one hand the breakdown voltage of the cell is reduced since the breakdown voltage of the cell is influenced by the field boosting at the pn junction between the p-type body region and the fourth n-type region, and on the other hand the highest field strength no longer occurs at the trench, but rather at the fourth n-type region.

The distance between the fourth region and the trench is intended to lie within the range of 10-200 nm, and preferably 50-200 nm. A distance of at least 100 nm is particularly preferred in this case.

The penetration depth of the fourth region is dependent on the penetration depth of the trench and, if present, of the p-float region. In this case, the penetration depth of the fourth region is intended not to significantly exceed the penetration depth of the trench or the p-float region. In one embodiment, the penetration depth of the fourth region is less than twice the penetration depth of the trenches.

In one embodiment of the semiconductor component according to the invention, the trenches have a penetration depth (trench depth) within the range of approximately 4 μm to approximately 8 μm. In this embodiment, in particular, the fourth region of the semiconductor body has a penetration depth within the range of approximately 3 μm to approximately 16 μm, and in particular within the range of 3 μm to 10 μm.

The fourth region of the first conductivity type is intended to be sufficiently highly doped, and the dose of the fourth region is intended to be below the breakdown charge, which is approximately $1.5 \times 10^{12}$ cm$^{-2}$. Typical doses for the fourth region lie between $1 \times 10^{11}$ cm$^{-2}$ and $1 \times 10^{12}$ cm$^{-2}$.

In this embodiment, the dose is defined as the integral over the concentration of the dopants $N_D$ in the vertical section (=direction y) by the following formula:

$$\text{Dose} = \int N_D dy$$

The semiconductor component according to one embodiment of the invention is a power IGBT configured as a high-voltage switch.

In the embodiment of a power IGBT, the semiconductor body furthermore has a collector region (1) of the second charge carrier type (p) between the drift region (cf. reference symbol 2 in FIG. 1) and the rear side contact (13), the collector region being more heavily doped than the drift region. In this embodiment, the rear side contact is usually in direct contact with the collector region over a large area. Such a power IGBT is also referred to as a non-punch-through (NPT) IGBT.

In another embodiment of the invention, which is referred to as a punch-through (PT) IGBT or as a field stop (FS) IGBT, the semiconductor body furthermore has a field stop region (also referred to as buffer region) of the first charge carrier type (n) between the drift region and the collector region, said field stop region being more heavily doped than the drift region.

In another embodiment of the invention, the semiconductor component according to the invention has a weakly dimensioned field stop layer (FS IGBT). In this embodiment, the doping of the field stop layer is dependent on the basic doping and the thickness of the first region and the thickness of the field stop layer and is to be chosen such that the blocking behavior of the FS IGBT can be designed such that the punch-through of the electric field takes place as far as the rear side emitter. In this embodiment, the punch-through is intended to take place above the maximum intermediate circuit voltage used of 850 V, for example, and below the dynamic clamping voltage of the cells of 1200 V, for example. The doping concentration of the field stop layer generally lies within the range of $1 \times 10^{14}$ to $5 \times 10^{14}$ charge carriers cm$^{-3}$.

In this embodiment, a current flow can occur immediately at any voltage in static operation, so that the semiconductor component is provided with built-in voltage limiting. The component according to the invention can therefore be designed in such a way that, at low currents, the voltage limiting takes place as a result of a punch-through of the electric field to the rear side emitter, and only at certain higher current densities does it take place as a result of the avalanche generation at the cell, whereby the component effects inherently soft switching since the tail current cannot undergo chopping. As soon as the current flow with excessively high di/dt stops, the field punches through the weakly dimensioned field stop and brings about a further flowing hole current.

Figure 6:
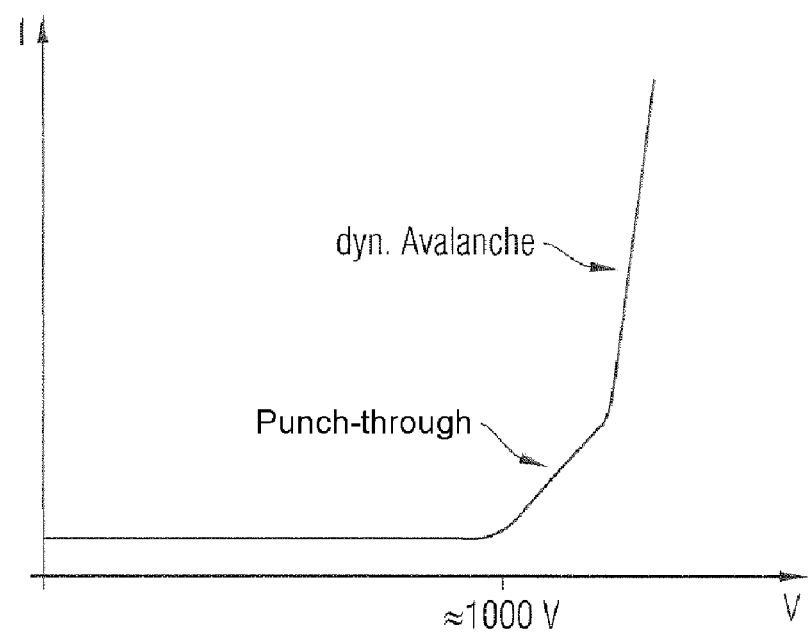
FIG. 6 illustrates the blocking behavior of an FS IGBT according to one embodiment of the invention.

The blocking behavior of an FS IGBT according to the invention is specified in FIG. 6, which illustrates the profile of the current I as a function of the voltage V present.

It can be gathered from FIG. 6 that, starting from a certain voltage that can be set through the doping of the fourth semiconductor region and the field stop layer, the "punch-through" takes place at the rear side emitter layer, and that the avalanche breakdown ("dyn. avalanche") takes place at a certain critical voltage, as a result of which only a slight voltage rise is to be noted since significantly more charge carriers can immediately be generated as a result of the avalanche multiplication.

In another embodiment of the invention, it is provided that the desired behavior of the component can be established by means of the reverse characteristic curves of the active region and of the edge structure being correspondingly coordinated with one another. In principle, a plurality of approaches is possible for this purpose, two of which are described with reference to FIGS. 7 and 8.

Figure 7:
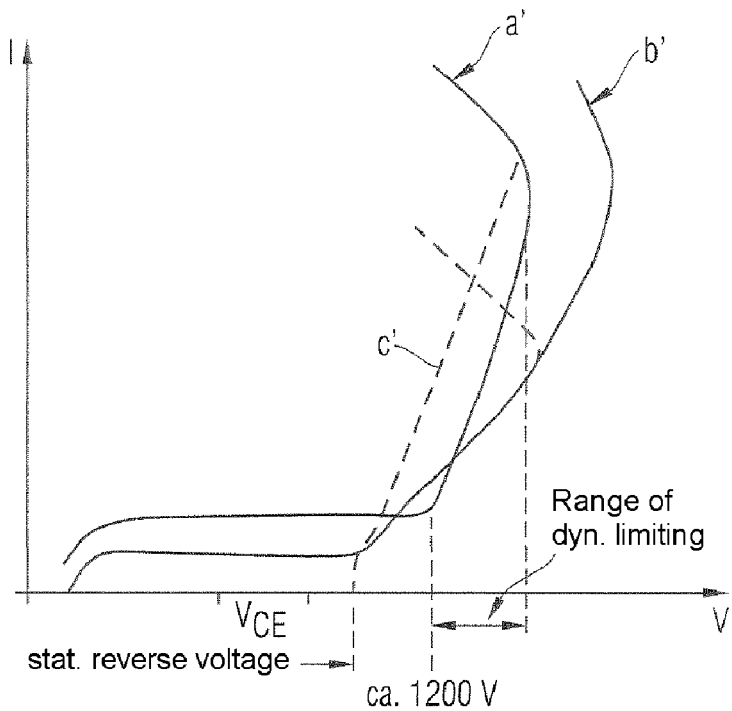
FIGS. 7-8 illustrate reverse characteristic curves of the active region and of the edge structure of the semiconductor component according to one embodiment of the invention.

As can be gathered from FIG. 7, the reverse characteristic curve of the active region is set in such a way that the component limits the overvoltage in the desired voltage range. The characteristic curve must have a positively differential profile up to the maximum currents that occur. As a result, the limiting voltage increases insignificantly with the current intensity. The reverse characteristic curve of the active region is designated by a', while the reverse characteristic curve of the edge structure is identified by b' and c'.

The reverse characteristic curve of the edge structure has a static breakdown voltage lying below the limiting voltage but above the intermediate circuit voltage used. In this embodiment, the characteristic curve of the edge structure may intersect that of the cell (line b') or else rise with a similar gradient to that of the cell (line c').

Figure 8:
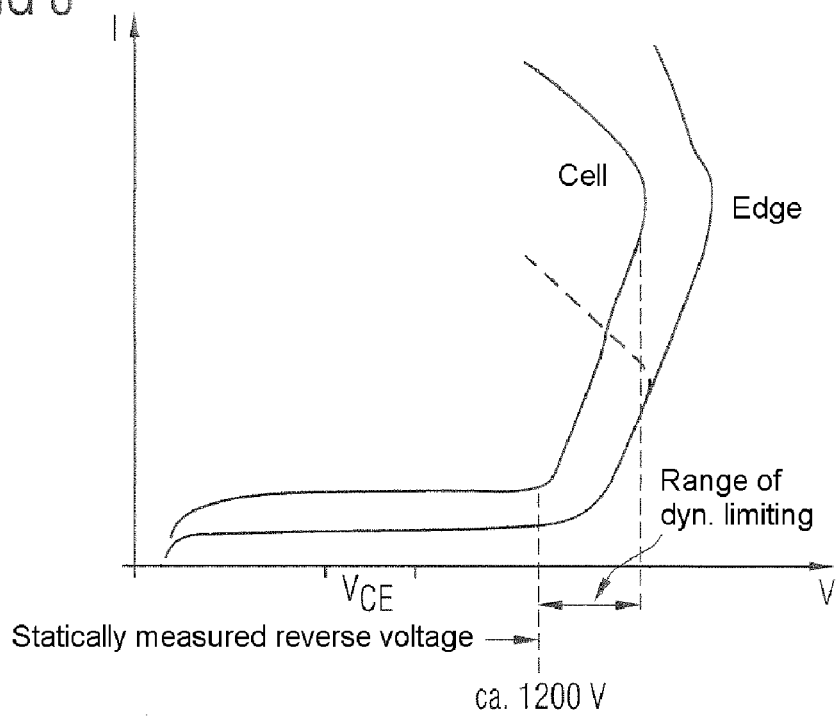

A different concept is illustrated in FIG. 8. The reverse characteristic curve of the active regions is designed, in the manner already described in FIG. 7, in such a way that the smallest dynamic limiting is at 1200 V and rises with the current. In contrast to the embodiment of FIG. 7, the reverse voltage of the edge structure lies above that of the cell in the entire current range. The static reverse voltage that is measured in this case is the reverse voltage of the cell region, which is practically equal to the dynamic limiting voltage for very small currents (approximately 1200 V).

What is crucial is that, as set out in FIGS. 7 and 8, the blocking capability of the component is designed in respect of the reverse characteristic curves of the active region. Measures which reduce or limit the reverse voltage are necessary only when they are required for setting the positively differential profile into the desired current range.

In the case of the IGBT, it is possible to configure the edge termination of the IGBT by means of a field plate edge structure or annular edge structure of the second charge type (p) or JTE edge structure. The edge breakdown voltage then usually lies below the cell array breakdown voltage.

In one embodiment, the cell array has a lower blocking capability than the edge, so that an edge concept having the highest possible blocking capability should be chosen. The field plate edges usually block 80 to 85% of the bulk breakdown voltage. From VLD edges (VLD=variation of lateral doping), in which the drift zone is doped gradually, it is known that 95 to 100% of the bulk breakdown voltage can be attained. This is achieved by virtue of the field distribution being very homogeneous in the edge region, which can be established by means of the gentle lateral doping profile of the VLD zone.

This lateral doping profile constitutes a problem in present-day IGBTs since, even at relatively low currents in the event of breakdown, the breakdown location jumps back from the edge into the cell array. The conventional IGBTs are then destroyed because a negative differential characteristic curve profile of the cell array and thus splitting occur on account of the field stop concept. The consequence of this is that the very attractive VLD concept cannot be used in practice if it is optimized for a laterally very homogeneous field distribution in the edge region and thus a maximum reverse voltage. For designs with an inhomogeneous field distribution, however, there is a lessening of the advantage of a higher reverse voltage in comparison with the field plate edge concept.

In the embodiment of a dynamic clamping IGBT, however, it is necessary anyway to realize a positively differential reverse characteristic curve of the cell array over wide current ranges, as a result of which it is precisely desirable to shift the breakdown location from the edge into the cell array. Rather, the VLD edge makes it possible for the cell blocking capability not to have to be reduced to an excessively great extent in order to achieve a bulk breakdown.

One embodiment of the invention therefore provides for the edge concept to have a high blocking capability and to have, in particular, a VLD structure.

In order to ensure that below the edge in the clamping case, the breakdown voltage of the edge does not fall below that of the cell array, two preconditions have to be met.

Firstly, no or as little charge as possible that might result dynamically in a distortion of the field below the edge should be injected under the edge. Owing to the greater distance between the charge stored in the edge and the nearest contact hole, dynamically less favorable field distributions than in the cell array might otherwise possibly occur due to propagation time effects.

Secondly, at high current densities it can happen that the electric field flips over, so that the highest field strength no longer occurs at the front side of the component, but rather at the rear side of the component. The blocking capability of the component decreases dramatically in the event of the electric field flipping over, with the result that it must be ensured that said flipping over of the field can occur in the edge region only after it has already taken place in the cell array beforehand.

The electron injection under the edge can be prevented or significantly reduced if the cells are shut down on the length scale of an ambipolar diffusion length adjacent to the edge. This can be achieved by already making provision in the layout for the expansion of the p$^+$-type mask for the cells to be shut down. As a result, the p$^+$-type implantation diffuses to the trench sidewall or is implanted as far as the trench sidewall, with the result that the threshold voltage of said cells is dramatically increased and they practically no longer switch on. Ultimately, however, the precise measure is insignificant as long as the electron injection is prevented from the front side on the scale of a diffusion length to the edge. A further possibility for obtaining this may be achieved by omitting the source implantation.

In order to avoid the flipping over of the electric field, the bipolar gain should be reduced in a targeted manner in the edge region. This both improves the static blocking capability and prevents the occurrence of dynamic avalanche since the collector-side hole injection is prevented.

There are a number of possibilities for reducing the bipolar gain in the edge region. One possibility is to obtain a local reduction of the charge carrier lifetime in the edge region. For this purpose, it is possible to reduce the charge carrier lifetime in the entire vertical construction of the edge by means of a masked electron irradiation. This measure is particularly effective in particular when VLD edges are employed, since, when the reverse voltage is applied, in this case, the neutral zone is wider in the edge region than in the inner region of the chip. If, at extremely high current densities, a flipping over of the field still occurs even in the case of this variant, it is then counteractively controlled by an anodal hole injection since the width of the neutral zone is only very small in this case.

In one embodiment, the charge carrier lifetime is reduced in the p-type emitter layer or shortly before the latter, but not more than 1/5 of the vertical component extent.

In the lateral extent, it is preferably the case that the charge carrier lifetime is limited in regions below the edge and up to a maximum of five ambipolar diffusion lengths from the edge into the cell array.

The charge carrier lifetime can be set for example by means of proton or helium irradiation.

An alternative embodiment for reducing the bipolar gain in the edge region consists e.g. in carrying out a proton or helium irradiation on the chip rear side in or before the rear side emitter, which remains restricted to the edge region. In this case, the lateral extent of the reduction may extend from the edge additionally 1 to 5 ambipolar diffusion lengths from the edge into the cell array. The vertical position of this local reduction should be located in or relatively flat before the rear side p-type emitter. At the nominal reverse voltage, the electric field should still not reach this zone, but rather should have been dissipated shortly beforehand in the field stop zone. As a result of this, on the one hand, the emitter efficiency is reduced in the edge and, on the other hand, increased leakage currents do not arise since the field does not reach into the recombination zones.

Another embodiment for reducing the bipolar gain in a targeted manner in the edge region consists in not even implanting the rear side p-type collector in the edge region at all, by means of a masking.

A slightly positively differential reverse characteristic curve of the cell array can already arise as a result of the greatly localized avalanche at the newly created front-side pn junction. However, the field stop of the component is preferably designed with its dose so low that the dose lies below the breakdown charge of silicon, so that the electric field punches through the field stop at the clamping voltage, but not just at the intermediate circuit voltage. The field punch-through additionally reduces the reverse voltage of the cell array in comparison with the edge and partly defines the clamping voltage. In particular, the hole injection from the p-type emitter, in the inner region of the component, enables a positively differential profile of the reverse characteristic curve. It has proved to be advantageous if the field stop is produced by means of proton implantation.

FIGS. 1-8 have already been explained in more detail in the introductory part of the description and in connection with the semiconductor component according to the invention.

Figure 9A:
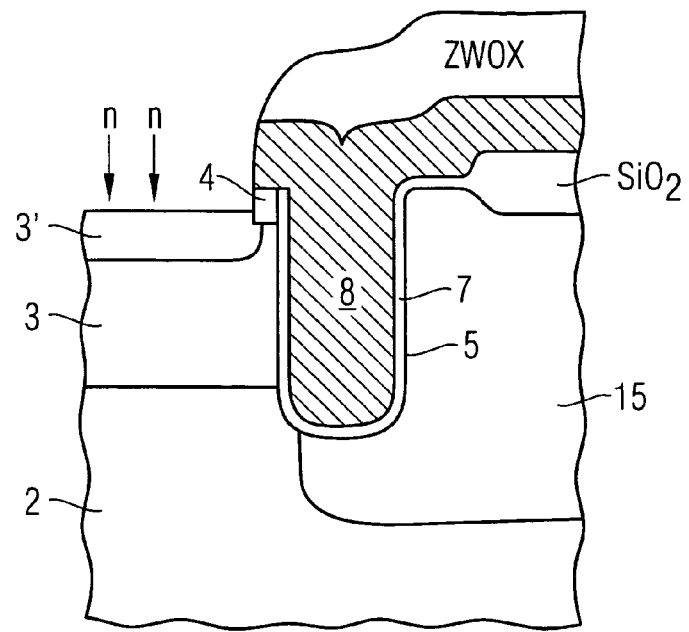
FIGS. 9a and 9b illustrate schematic illustrations of a possible production process during the production of IGBTs according to one embodiment of the invention.

As illustrated in FIG. 9a, the IGBT cell is completed conventionally up to the contact hole. An intermediate oxide Zwox is thus open in the region of a contact hole to a $p^{++}$-doped contact layer 3' of the body zone 3. By implantation of phosphorus or arsenic with a correspondingly high energy, the n-type region is implanted under the p-type body region and annealed by means of a subsequent heat treatment step.

Figure 9B:
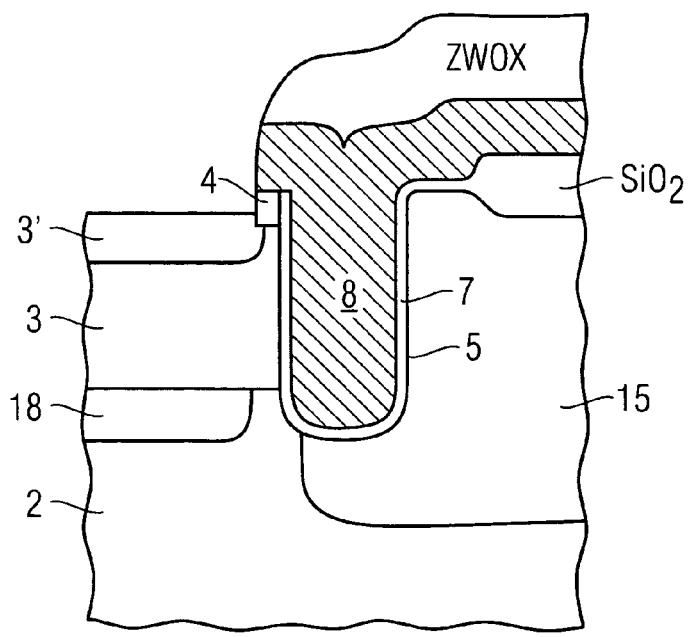

As set out in FIG. 9b, this results in an n-type region 18 that directly adjoins the p-type body region 3 but does not reach as far as the trench 5 laterally. An alternative embodiment includes producing the n-type region 18 by means of a proton implantation with subsequent heat treatment. In this embodiment, implantation is likewise effected through the still open contact hole, although only after all the thermal treatments above approximately 500° C. have taken place. The doping effect of the proton implantation is then produced with the thermal budget of the still following metallization and insulation steps with polyimide. One variant is implantation with phosphorus, however, since this uses lower implantation energies by comparison with arsenic in order to locate the implantation range below the p-type body region 3. In comparison with the doping with protons, the variant with phosphorus affords the advantage that the phosphorus doping can be stabler than the proton doping under severe thermal loadings, such as in short-circuit operation.

Once the IGBT according to the invention has been obtained in this way, it can be designed with a VLD edge concept at its edges. A trench edge may also be used as an alternative.

The cells are shut down near the edge region in the case of a lateral distance of approximately one ambipolar diffusion length. This is done by expanding the $p^+$-type mask during the doping of the contact zone 18 for the edge cells. This then results in a channel shutdown for said cells. As an alternative, said cells can also be shut down by the omission of the source implantation (cf. FIG. 2).

Figure 10:
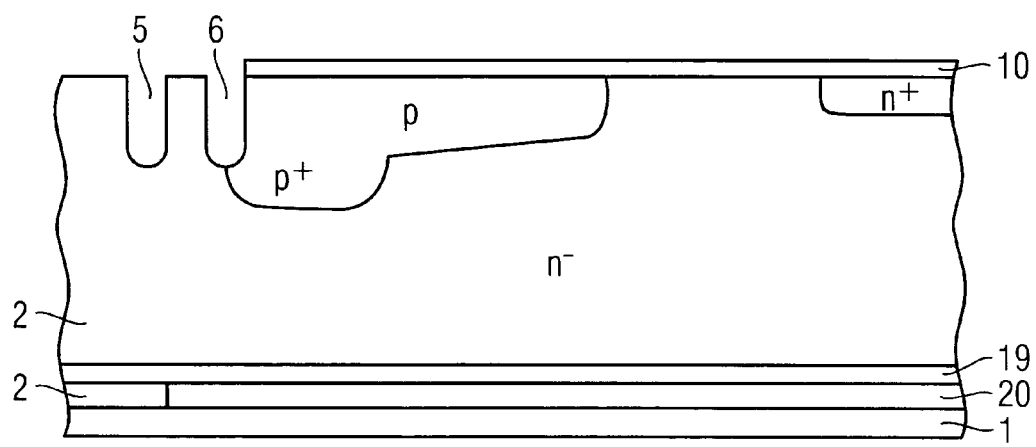
FIG. 10 illustrates a schematic illustration of an edge structure with masked lifetime reduction below the edge and a schematic illustration of the IGBT according to one embodiment of the invention.
Figure 11:
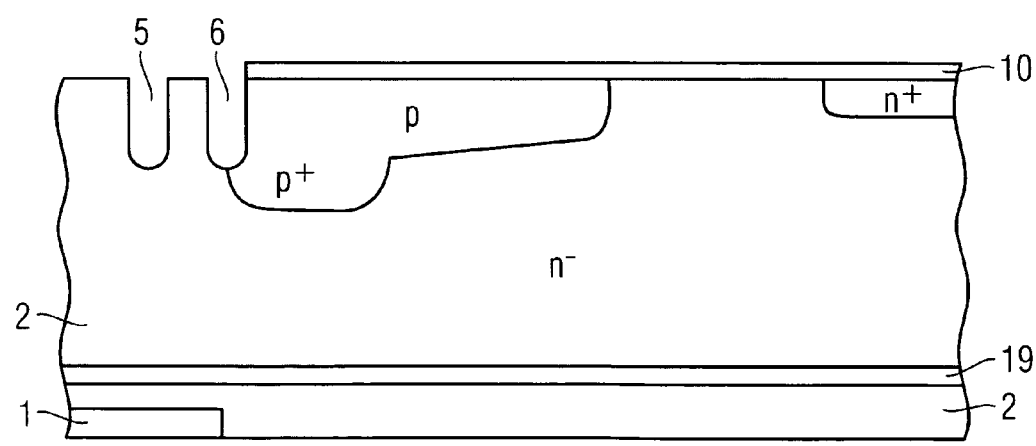
FIG. 11 illustrates a schematic illustration of an edge structure according to one embodiment of the invention with masked omission of the p-type emitter below the edge in the case of the invention.

By using of an aligned rear side phototechnology, the implantation of the p-type collector zone 1 is omitted below the edge, as is illustrated in FIG. 11. This leads to an increased edge blocking capability. As an alternative, by using an aligned rear side phototechnology after the completion of an n-doped field stop zone 19 (also optionally provided in FIG. 11) in the n-conducting drift zone 2, a masked proton implantation is carried out in order thus to form a recombination zone 20 before the collector zone 1 below the edge, as is illustrated in FIG. 10. In one embodiment, the thermal budget for stabilizing this implantation is below 380° C. and 2 h.

The field stop zone 19 of the component is in one embodiment produced by means of proton implantation. The dose of the active field stop doping lies below the breakdown charge of silicon, so that, as has been explained in more detail above, it is possible for the field punch-through to the p-type collector 1 to occur at the clamping voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An insulated gate semiconductor component comprising:
    a first semiconductor region comprising drift region of a first conductivity type;
    a second semiconductor region comprising body region of a second conductivity type, formed on or in an upper main surface of the first semiconductor region, said second conductivity type being opposite to said first conductivity type;
    a third semiconductor region comprising an emitter region of the first conductivity type formed selectively in a front surface of the second semiconductor region;
    a trench having an opening in the front surface of the third semiconductor region and extending into a depth from the opening into the second semiconductor region;
    a dielectric layer provided in the trench and completely covers a bottom thereof and extends to a location higher than an upper main surface of the first semiconductor region;
    a gate electrode filled in the interior of the trench; and
    a fourth semiconductor region of the first conductivity type in direct contact with the first and second semiconductor regions, wherein the fourth semiconductor region is arranged at a distance from the trench,
    wherein a distance between the trench and the fourth semiconductor region is within the range of 10-200 nm, and
    wherein a dopant dose of the fourth semiconductor region is within the range of $1\times10^{11}$ cm$^{-2}$ to $1\times10^{12}$ cm$^{-2}$.

2. The semiconductor component as claimed in claim 1, comprising wherein the second semiconductor region has a contact layer more heavily doped with the dopants of the second conductivity type than the second semiconductor region.

3. The semiconductor component as claimed in claim 1, comprising wherein the distance between the trench and the fourth semiconductor region is within the range of 50-150 nm.

4. The semiconductor component as claimed in claim 1, comprising wherein the distance between the trench and the fourth semiconductor region is within the range of 100-120 nm.

5. The semiconductor component as claimed in claim 1, comprising wherein a penetration depth of the fourth semiconductor region does not exceed twice a penetration depth of the trench.

6. The semiconductor component as claimed in claim 1, comprising wherein a penetration depth of the trench is within the range of 4 µm to 8 µm.

7. The semiconductor component as claimed in claim 6, comprising wherein a penetration depth of the fourth semiconductor region is within the range of 3 µm to 16 µm.

8. The semiconductor component as claimed in claim 7, comprising wherein a penetration depth of the fourth semiconductor region is within the range of 3 µm to 10 µm.

9. The semiconductor component as claimed in claim 1, comprising wherein the fourth semiconductor region is doped with a dose that is lower than the breakdown charge.

10. The semiconductor component as claimed in claim 1, comprising wherein the fourth semiconductor region is doped with a dose that is 1-70% of the breakdown charge.

11. The semiconductor component as claimed in claim 1, comprising wherein a layer of the first conductivity type is arranged as a field stop layer below the first semiconductor region of a first conductivity type, said layer being more highly doped than the first semiconductor region.

12. The semiconductor component as claimed in claim 11, comprising wherein the field stop layer has a doping within the range of $1 \times 10^{14}$ to $5 \times 10^{14}$ charge carriers $cm^{-3}$.

13. The semiconductor component as claimed in claim 1, comprising wherein a layer of the second conductivity type is arranged as a collector layer, at a lower main area of the semiconductor component.

14. The semiconductor component as claimed in claim 1, comprising wherein an edge structure of the semiconductor component has a high blocking capability.

15. The semiconductor component as claimed in claim 1, comprising wherein an edge structure is a VLD structure.

16. The semiconductor component as claimed in claim 1, comprising wherein a charge carrier lifetime is reduced in an edge region of the semiconductor component by a recombination zone formed by a masked electron irradiation.

17. The semiconductor component as claimed in claim 16, comprising wherein, in a vertical direction of the component, the charge carrier lifetime is reduced in a p-type emitter layer or shortly before the latter, but in total over not more than ⅕ of the vertical component extent.

18. The semiconductor component as claimed in claim 17, comprising wherein the charge carrier lifetime is limited in regions below an edge of the semiconductor component which regions extend up to a maximum of five ambipolar diffusion lengths from the edge into the cell array.

19. The semiconductor component as claimed in claim 18, comprising wherein the charge carrier lifetime is limited by proton or helium irradiation.

20. The semiconductor component as claimed in claim 1, comprising wherein a chip rear side of the semiconductor component is treated by a proton or helium irradiation prior to the production of a rear side emitter of the semiconductor component.

21. The semiconductor component as claimed in claim 16, comprising wherein a collector layer of the semiconductor component is not present in an edge region of the semiconductor component.

* * * * *